United States Patent
Lee

(10) Patent No.: US 6,885,603 B2
(45) Date of Patent: Apr. 26, 2005

(54) DYNAMIC RANDOM ACCESS MEMORY DEVICES AND METHOD OF CONTROLLING REFRESH OPERATION THEREOF

(75) Inventor: Dong-yang Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 43 days.

(21) Appl. No.: 10/676,232

(22) Filed: Oct. 1, 2003

(65) Prior Publication Data

US 2005/0041500 A1 Feb. 24, 2005

(30) Foreign Application Priority Data

Dec. 23, 2002 (KR) ................................ 10-2002-0082674

(51) Int. Cl.$^7$ ................................................ G11C 7/00
(52) U.S. Cl. .............. 365/222; 365/230.06; 365/189.05
(58) Field of Search ............................ 365/222, 230.06, 365/230.08, 189.05, 233

(56) References Cited

U.S. PATENT DOCUMENTS 6,667,933 B1 * 12/2003 Tomita ........................ 365/233

* cited by examiner

*Primary Examiner*—David Lam
(74) *Attorney, Agent, or Firm*—Myers Bigel Sibley & Sajovec, PA

(57) ABSTRACT

A Dynamic Random Access Memory (DRAM) device can include a DRAM cell array configured to be periodically refreshed and a refresh control circuit that is configured to issue an internal refresh command to the DRAM cell array to provide periodic refresh of the DRAM cell array. The refresh control circuit can further include a refresh information signal to external of the DRAM device before the internal refresh command is issued to the DRAM cell array.

12 Claims, 1 Drawing Sheet

DYNAMIC RANDOM ACCESS MEMORY DEVICES AND METHOD OF CONTROLLING REFRESH OPERATION THEREOF

CLAIM FOR PRIORITY

This application claims priority to Korean Patent Application No. 10-2002-0082674, filed on Dec. 23, 2002, in the Korean Intellectual Property Office, the disclosure of which is incorporated herein in its entirety.

FIELD OF THE INVENTION

The invention relates to integrated circuit devices, and more particularly, to Dynamic Random Access Memory (DRAM) devices and methods of operating DRAM devices.

BACKGROUND

A DRAM device may need to perform a refresh operation periodically to maintain data stored therein. As understood by those skilled in the art, a memory controller, that is separate from the DRAM device, is sometimes used to control operation of the DRAM device (including the refresh operations) by issuing commands to the DRAM device. For example, the memory controller can issue a refresh command to the DRAM device so that the DRAM device performs a refresh operation. The DRAM device may be unable to perform other operations while performing a refresh operation.

The DRAM controller may be designed to periodically issue refresh commands in a set period of time. However, the DRAM controller may issue more refresh commands than required, thereby causing the DRAM device to perform unnecessary refresh operations, which may result in increased DRAM power consumption.

SUMMARY

A Dynamic Random Access Memory (DRAM) device can include a DRAM cell array configured to be periodically refreshed and a refresh control circuit that is configured to issue an internal refresh command to the DRAM cell array to provide periodic refresh of the DRAM cell array. The refresh control circuit can further include a refresh information signal to external of the DRAM device before the internal refresh command is issued to the DRAM cell array.

DESCRIPTION OF EMBODIMENTS ACCORDING TO THE INVENTION

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. Like numbers refer to like elements throughout.

Figure 1:
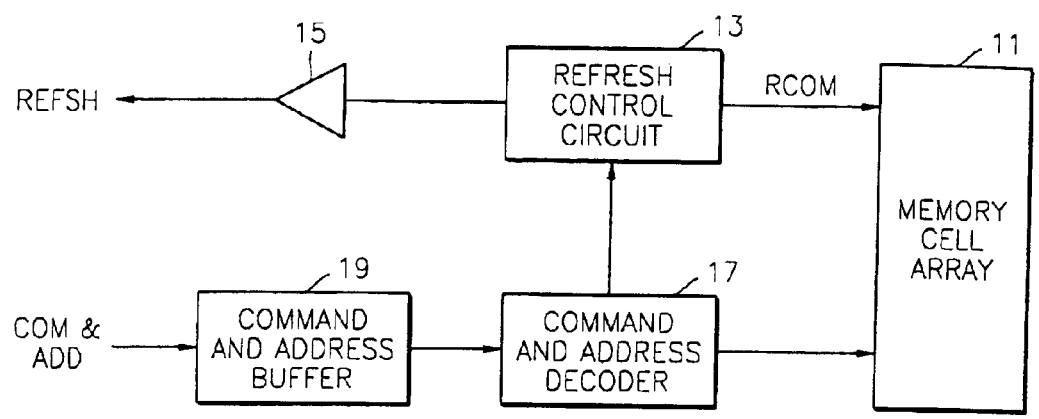
FIG. 1 is a block diagram that illustrates embodiments of DRAM devices according to the present invention.

Referring to FIG. 1, the memory device of the present invention includes a memory cell array 11, a refresh control circuit 13, a buffer 15, a command and address decoder 17, and a command and address buffer 19.

In particular, the refresh control circuit 13 periodically issues an internal refresh command RCOM in order to refresh the memory cell array 11 without an externally issued refresh command. Also, the refresh control circuit 13 generates a refresh information signal REFSH and outputs it before the memory cell array 11 is refreshed.

The command and address buffer 19 receives and buffers a command COM and an address ADD, which are issued externally. The command and address decoder 17 decodes the buffered command and address and controls the refresh control circuit 13 and the memory cell array 11.

Specifically, in the memory device, the refresh information signal REFSH is transmitted to a memory controller (external to the memory device), and the memory cell array 11 is refreshed a predetermined delay time after the refresh information signal REFSH is activated. In doing so, the memory device performs an operation according to a command, which is input to the memory device, before the memory controller receives the refresh information signal REFSH from the memory device.

In other words, when the memory device receives a command issued by the external memory controller during the predetermined delay time, the memory device performs the requested operation before the refresh operation is performed. Thus, the memory device will perform a requested operation even though a refresh operation maybe performed soon.

Figure 2:
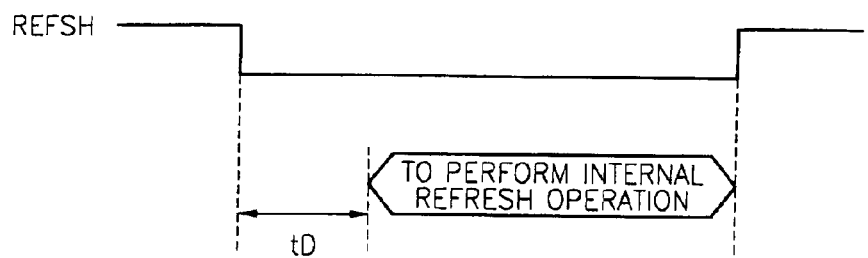
FIG. 2 is a timing diagram that illustrates embodiments of refresh operations of the DRAM memory devices illustrated by FIG. 1.

As shown in FIG. 2, when the memory device determines that a refresh operation is needed, the memory cell array 11 is refreshed a predetermined delay time $t_D$ after the refresh information signal REFSH is activated (low). If the memory device receives a command from the memory controller during the predetermined delay time $t_D$, an operation according to the command is performed before the memory cell array II is refreshed. After the requested operation is completed, the refresh control circuit 13 may complete the refresh operation (if still needed).

When the refresh operation is complete, the refresh control circuit 13 deactivates the refresh information signal REFSH to be high and informs the memory controller that a write/read operation can be normally performed. Meanwhile, unlike the foregoing refresh control method, after the refresh information signal is activated to be low, the memory device may await a command and perform a requested operation according to the command before the memory cell array 11 is refreshed.

As described above, embodiments of memory devices according to the invention can perform a refresh operation without an externally issued refresh (from the memory controller). Accordingly, unnecessary refresh operations may be reduced, thus reducing power consumption.

In the drawings and specification, there have been disclosed embodiments according to the invention and, although, specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed:

1. A Dynamic Random Access Memory (DRAM) device comprising:

a DRAM cell array configured to be periodically refreshed; and a refresh control circuit configured to issue an internal refresh command to the DRAM cell array to provide periodic refresh of the DRAM cell array and configured to provide a refresh information signal to external of the DRAM device before the internal refresh command is issued to the DRAM cell array.

2. A device according to claim 1 wherein the refresh information signal is transmitted to a memory controller configured to issue operation commands to the DRAM device.

3. A device according to claim 1 wherein the memory cell array is refreshed a predetermined time after the refresh information signal is activated.

4. A device according to claim 3 wherein an external command received by the DRAM device during the predetermined time is carried out before the periodic refresh operation is carried out in the DRAM cell array.

5. A device according to claim 3 wherein refresh information signal is deactivated responsive to the refresh operation in the DRAM cell array being completed.

6. A device according to claim 1 wherein the predetermined time is configured to allow a current memory operation in an external memory controller to complete before initiating the refresh operation in the DRAM cell array.

7. A method of controlling a refresh operation of DRAM device, the method comprising:

providing a refresh information signal to external of the DRAM device before an internal refresh command is issued to a DRAM cell array.

8. A method according to claim 7 wherein the refresh information signal is transmitted to a memory controller that external to the DRAM device.

9. A method according to claim 7 wherein the DRAM cell array is refreshed a predetermined time after the refresh information signal is activated.

10. A method according to claim 9 further comprising:

delaying the refresh operation in the DRAM cell array if an external command is received by the DRAM device during the predetermined time.

11. A method according to claim 9 further comprising:

deactivating the refresh command responsive to completion of the refresh operation the DRAM cell array.

12. A method according to claim 7 wherein after the refresh information signal is activated, an operation according to an initially input external command is performed before the memory cell array is refreshed.

* * * * *